United States Patent
Harz et al.

(10) Patent No.: US 10,724,916 B2
(45) Date of Patent: Jul. 28, 2020

(54) VEHICLE CONTROL DEVICE

(71) Applicant: WABCO GmbH, Hannover (DE)

(72) Inventors: Juri Harz, Ronnenberg (DE); Tobias Kortlang, Gehrden (DE)

(73) Assignee: Wabco GmbH, Hannover (DE)

( * ) Notice: Subject to any disclaimer, the term of this patent is extended or adjusted under 35 U.S.C. 154(b) by 220 days.

(21) Appl. No.: 15/764,718

(22) PCT Filed: Sep. 2, 2016

(86) PCT No.: PCT/EP2016/001487
§ 371 (c)(1),
(2) Date: Mar. 29, 2018

(87) PCT Pub. No.: WO2017/054902
PCT Pub. Date: Apr. 6, 2017

(65) Prior Publication Data
US 2018/0283975 A1 Oct. 4, 2018

(30) Foreign Application Priority Data
Oct. 1, 2015 (DE) .................. 10 2015 012 740

(51) Int. Cl.
*G01L 9/00* (2006.01)
*G01L 9/14* (2006.01)
(Continued)

(52) U.S. Cl.
CPC ........ *G01L 19/148* (2013.01); *G01L 19/0084* (2013.01); *G01L 19/147* (2013.01);
(Continued)

(58) Field of Classification Search
CPC ........ B60Y 2400/306; B60Y 2410/115; H05K 5/0017; H05K 5/0043; H05K 5/0204;
(Continued)

(56) References Cited

U.S. PATENT DOCUMENTS 4,640,561 A * 2/1987 George ................ H01R 12/592
439/77
5,880,372 A * 3/1999 Nasiri ................. G01L 19/0084
73/723
(Continued)

FOREIGN PATENT DOCUMENTS

DE 10037842 A1 8/2001
DE 10122330 A1 2/2002
(Continued)

OTHER PUBLICATIONS

English language abstract and machine translation for DE10037842 (A1) extracted from http://worldwide.espacenet.com database on Mar. 28, 2018, 11 pages.
(Continued)

Primary Examiner — Nguyen Q. Ha
(74) Attorney, Agent, or Firm — Warner Norcross + Judd, LLP

(57) ABSTRACT

Disclosed is a vehicle control unit (10) comprising an electronic circuit, a circuit board (15), a housing (12) and at least one pressure sensor as a vehicle sensor (11), wherein the at least one vehicle sensor (11) is electrically connected to the electronic circuit for receiving measurement values. The vehicle sensor (11) is connected to the circuit board (15) via at least one press-fit contact (22). A vehicle comprising the vehicle control unit (10) is also disclosed.

12 Claims, 1 Drawing Sheet

(51) Int. Cl.
*G01L 19/00* (2006.01)
*G01L 19/14* (2006.01)
*H05K 5/00* (2006.01)
*H05K 5/02* (2006.01)
*H05K 5/03* (2006.01)
*H05K 5/06* (2006.01)

(52) U.S. Cl.
CPC ......... *H05K 5/0017* (2013.01); *H05K 5/0043* (2013.01); *H05K 5/0204* (2013.01); *H05K 5/0247* (2013.01); *B60Y 2400/306* (2013.01); *B60Y 2410/115* (2013.01); *H05K 5/03* (2013.01); *H05K 5/061* (2013.01)

(58) Field of Classification Search
CPC ........ H05K 5/0247; H05K 5/03; H05K 5/061; G01L 9/00; G01L 19/00; G01L 19/0084; G01L 19/14; G01L 19/147; G01L 19/148
See application file for complete search history.

(56) References Cited

U.S. PATENT DOCUMENTS

| | | | | |
|---|---|---|---|---|
| 6,773,078 | B2* | 8/2004 | Dinkel | B60T 8/363 303/113.1 |
| 7,000,478 | B1* | 2/2006 | Zwollo | G01K 1/08 374/E1.011 |
| 2003/0090147 | A1 | 5/2003 | Risch et al. | |
| 2009/0140572 | A1* | 6/2009 | Kim | B60T 8/368 303/17 |
| 2010/0202110 | A1 | 8/2010 | Becker et al. | |
| 2012/0240396 | A1 | 9/2012 | Becker et al. | |
| 2014/0285987 | A1 | 9/2014 | Nagashima et al. | |
| 2014/0352415 | A1* | 12/2014 | Groenhuijzen | F02B 77/085 73/114.18 |

FOREIGN PATENT DOCUMENTS

| | | | | |
|---|---|---|---|---|
| DE | 10133066 A1 * | 1/2003 | ........... | G01L 9/0075 |
| DE | 202004020236 U1 | 5/2006 | | |
| DE | 102007029913 A1 | 1/2009 | | |
| DE | 102014203301 A1 | 9/2014 | | |
| DE | 102013220091 A1 | 4/2015 | | |
| EP | 1152231 A2 | 11/2001 | | |

OTHER PUBLICATIONS

International Search Report for PCT/EP2016/001487, dated Dec. 8, 2016, 3 pages.
English language abstract and machine translation for EP1152231 (A1) extracted from http://worldwide.espacenet.com database on Mar. 28, 2018, 12 pages.
English language abstract and machine translation for DE202004020236 (U1) extracted from http://worldwide.espacenet.com database on Mar. 28, 2018, 6 pages.
English language abstract and machine translation for DE102013220091 (A1) extracted from http://worldwide.espacenet.com database on Mar. 28, 2018, 24 pages.

* cited by examiner

VEHICLE CONTROL DEVICE

CROSS-REFERENCE TO RELATED APPLICATIONS

This application is the National Stage of International Application No. PCT/EP2016/001487, filed on 2 Sep. 2016, which claims priority to and all advantages of German Patent Application No. 10 2015 012 740.3, filed on 1 Oct. 2015, the content of which is hereby incorporated by reference.

FIELD OF THE INVENTION

The invention generally relates to a vehicle control unit and, more specifically, to a vehicle control unit comprising at least one vehicle sensor for receiving measurement values.

BACKGROUND OF THE INVENTION

Vehicle control units are used for monitoring and controlling a number of functions of a vehicle. Such vehicle control units work partly autonomously and partly depending on driver interventions. Individual vehicle control units are as a rule specialized to individual or a few functions, such as to the brake system. There is thus typically a series of different vehicle control units in a vehicle.

To determine the actual state of relevant measurement values, a vehicle control unit is fitted with or connected to suitable vehicle sensors. The vehicle sensors are electrically connected to the vehicle control unit or to an electronic circuit or circuit board that is disposed within a housing of the vehicle control unit.

In the prior art, two embodiments of the electrical connection between the vehicle sensor and the vehicle control unit are known, which are dependent on the installation position and on the type of the measurement value.

In the first case, the vehicle sensors are designed as separate units and only connected to the vehicle control unit or the electronic circuit thereof with an electrical cable connection. It is a disadvantage of this that the sensor must comprise a separate housing and a suitable fastening and above all that an electrical cable connection suffers in terms of the reliability thereof owing to vibrations and similarly to the duration. Cabling is also expensive, especially in the case of a plurality of sensors.

In the second case, the vehicle sensor is directly disposed on the electronic circuit or the electronic board, so that there is a fixed electrical connection thereby. The corresponding measurement value, for example an air pressure or similar, or the measurement object, such as a pressure medium, must be transported to the vehicle sensor, for example by means of cables, deflectors, or hoses. This has the disadvantage that suitable leadthroughs and connections, for example a pressure hose or similar, must be provided. In particular, in the case of the arrangement of a plurality of sensors, this solution is expensive.

SUMMARY OF THE INVENTION

The present invention provides a vehicle control unit with at least one vehicle sensor. More specifically, the vehicle control unit comprises an electronic circuit, a circuit board, a housing, and the at least one vehicle sensor. The at least one vehicle sensor comprises a pressure sensor and is electrically connected to the electronic circuit for receiving measurement values. The at least one vehicle sensor is electrically connected to the circuit board via at least one press-fit contact.

The housing typically comprises high mechanical stability and can thus be used for a reliable connection to the vehicle sensor. In particular, the loading of the circuit board of the electronic circuit is reduced.

The vehicle sensor typically comprises a sensor housing. The sensor housing may be connected in particular to the housing of the vehicle control unit. By connecting the two housings to each other, a secure fastening is achieved. The vehicle sensor or the sensor housing is generally mechanically connected to the housing. The mechanical connection provides secure support. In certain embodiments, the fastening between the sensor housing and the housing of the vehicle control unit is carried out exclusively with the housing. The latter ensures that no mechanical loading occurs, for example of electronic components or similar.

In certain embodiments, a latching connection, a plug connection, a bayonet connection and/or a clamped connection is made between the vehicle sensor or the sensor housing on one side and the housing on the other side. This enables easy assembly to be achieved, even optionally without tools.

In specific embodiments, the latching connection comprises at least one latching hook. This is used in particular to accept and fix the vehicle sensor. This enables a reversible and at the same time secure fastening of the vehicle sensor to be made to the housing.

In various embodiments, the vehicle sensor is connected to the electronic circuit, in particular by a flexible electrical connection. As the flexible electrical connection, a cable, at least one conducting track, at least one spring contact or similar flexible electrical connection can be utilized. In particular, at least one press-fit contact is provided, typically in combination with a cable and/or a conducting track. This substantially prevents the transmission of mechanical movements from the vehicle sensor to the electronic circuit or electronic board.

In certain embodiments, a reversible and/or flexible connection between the vehicle sensor or the sensor housing and the housing is implemented. A reversible connection enables simple replacement of the vehicle sensor, for example in the event of a defect. A flexible connection can absorb relative movements between the vehicle sensor and the housing of the vehicle control unit. In particular, this ensures a reduction of the loading on the housing parts. A flexible connection can for example be implemented by elastic components, for example a rubber seal or similar.

A permanent non-reversible connection between the vehicle sensor or the sensor housing and the housing may be implemented. In this way it is achieved that the vehicle sensor is fixedly connected to the vehicle control unit. To guarantee high operating reliability, the vehicle control unit and the vehicle sensor are typically completely replaced in the case of the defect of a component, so as to use only new related components as replacements.

In certain embodiments, the housing comprises a holder or receptacle for the vehicle sensor. The vehicle sensor can be inserted in the holder or receptacle, in particular with the housing thereof. The holder or receptacle is typically provided in the region of a wall of the housing. In particular, the vehicle sensor or the sensor housing is implemented as positively locked to the holder or receptacle. This ensures a secure and durable fastening of the vehicle sensor to vehicle control unit.

The vehicle sensor can be disposed within the housing or in the interior of the housing. However, the arrangement is typically carried out in the region of a housing wall and/or on a housing wall. On the one hand a good electrical contact and possibly a sealing of the housing against the surroundings are achieved thereby. On the other hand, a through hole can enable contact of the sensor to the outside for receiving measurement values.

The vehicle sensor can be disposed on the outside of the housing. The arrangement is carried out typically in the region of a housing wall. This enables simple mounting of the vehicle sensor on the vehicle control unit. Moreover, contact to a source of measurement data can be ensured in a simple way.

The vehicle sensor is typically connected to the source of measurement values via a rigid connection. In certain embodiments, the rigid connection comprises a pneumatic connection.

The vehicle sensor can alternatively be connected to the source of measurement values via a flexible connection. This is in particular a pneumatic connection. A hose, in particular a pressure hose, is generally utilized as the flexible connection. To receive measurement data, the source of measurement values is connected to the vehicle sensor. In certain embodiments involving the flexible connection, relative movements, which are due for example to vibrations, are not transmitted on the one hand, and on the other hand the mechanical stability is influenced as little as possible. By providing a hose for pressure measurement, the corresponding pressure medium can be fed to the vehicle sensor.

Assembly may be facilitated via known methods in the manner according to the invention by simple plugging together. Only during assembly do the circuit board and the contacts have to be held positionally accurately. As a result, the transmission of mechanical movements from the vehicle sensor to the electronic circuit or electronic board is substantially prevented.

BRIEF DESCRIPTION OF THE DRAWINGS

The invention is described in greater detail below with reference to the accompanying figures, in which.

DETAILED DESCRIPTION

Figure 1:
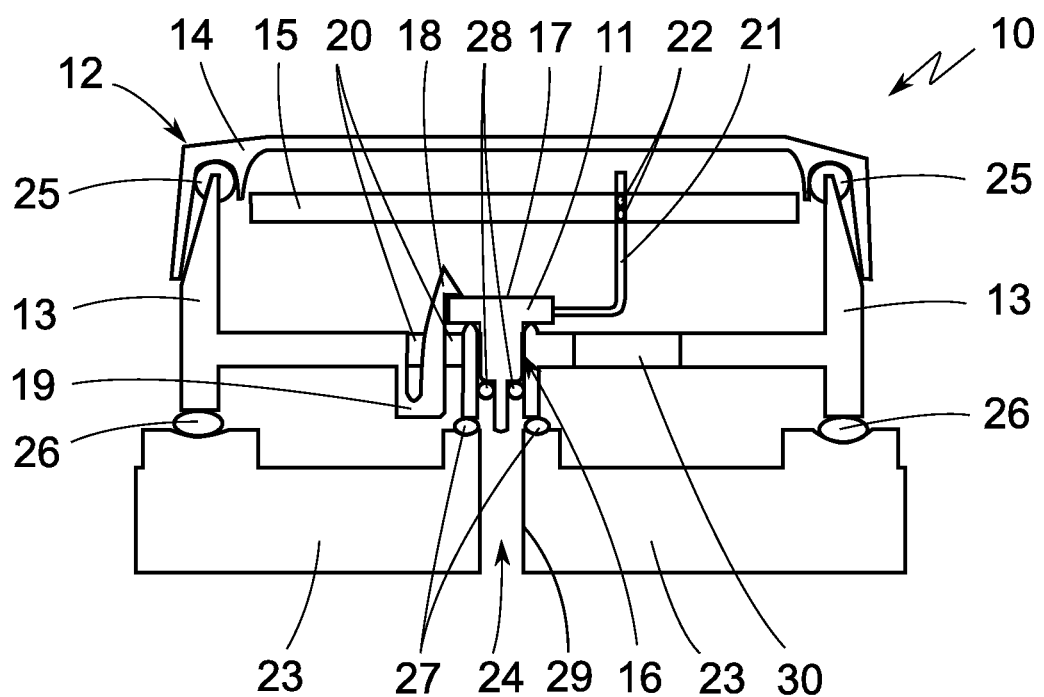
FIG. 1 shows a first exemplary embodiment of a vehicle control unit with a vehicle sensor according to the invention.

With reference to the specific embodiment of the Figures, wherein like numerals generally indicate like parts throughout the several views, FIG. 1 shows a lateral sectional view of a vehicle control unit 10 with a vehicle sensor 11. The vehicle control unit 10 is a brake control unit in the exemplary embodiment shown.

Accordingly, the vehicle sensor 11 is designed here as a pressure sensor. In the case of a pneumatic brake system, it is in particular an air pressure sensor for compressed air. The invention is suitable in principle for different types of vehicle control units, but is described for brake control units here by way of non-limiting example.

The vehicle control unit 10 comprises a housing 12. The housing 12 is embodied as a so-called electronics housing. It comprises a lower housing part 13 and a housing lid 14. In order to protect the electronics against moisture, this typically forms a watertight inner space that is closed at least against water spray relative to the surroundings. A circuit board 15 is disposed in an inner space, i.e., in an interior of the housing 12. The electronic components of the electronic circuit of the vehicle control unit 10 are disposed on the circuit board 15.

The sensor 11 is disposed partly in the interior of the housing 12 and partly outside. In the exemplary embodiment shown, the vehicle sensor 11 is inserted in the lower base plate of the lower part of the housing 13. For this purpose, a recess 16 is provided in the lower housing part 13. The recess 16 corresponds to the external dimensions of the inserted vehicle sensor 11. The vehicle sensor 11 is plugged into the recess from the interior of the housing 12.

The vehicle sensor 11 is represented here only schematically. The contours shown actually correspond to those of a corresponding sensor housing 17 of the vehicle sensor 11. The actual sensor system of the sensor 11 is disposed in the interior of the sensor housing 17, but is not represented here for reasons of clarity. The dimensions of the sensor housing 17 in a lower inserted region correspond to the dimensions of the recess 16. In an upper region, the housing 17 comprises a widened point that prevents the sensor housing 17 from slipping through the recess 16.

In order to prevent the vehicle sensor 11 from slipping out of the recess 16 upwards in the vertical direction, a latching connection may be provided. For this purpose, at least one latching hook 18 is provided on a spring element 19 on the lower housing part 13. To simplify manufacturing, both the spring element 19 and the at least one latching hook 18 are made in one piece from the material of the lower part of the housing 13. In fact, the lower housing part 13 is typically a molded part made in one piece, for example an injection molded part. To simplify assembly and for better durability, a plurality of latching hooks 18 can also be provided.

In order to ensure mobility of the latching hook 18 with the spring element 19, in a region of the lower part of the housing 13 a recess 20 is provided in the range of movement of the latching hook 18. The recess 20 enables a horizontal movement of the latching hook in the plane of the drawing 18.

The latching hook 18 is arranged to spring out to the right in the plane of the drawing in order to overlap the sensor housing 17 from above and to contact it laterally with spring force. It is thereby prevented that the vehicle sensor 11 can be moved in the plane of the drawing upwards out of the recess 16 against the latching hook 18. In order to enable removal of the vehicle sensor 11, the latching hook 18 is accordingly previously moved to the left in the plane of the drawing against the spring force of the spring element 19 and out of engagement with the sensor housing 17.

The vehicle sensor 11 is moreover electrically connected to the circuit board 15 via an electrical connection, such as a lead frame 21 shown here or alternatively a cable or other electrical conductors. By using a flexible electrical conductor, such as the lead frame or a cable, the mechanical loading on the circuit board 15 is minimized.

The conducting connection between the lead frame 21 and the circuit board 15 is made via press-fit contacts 22. The press-fit contacts 22 are inserted into suitable openings of the circuit board 15 for contacting. They hold there by the spring action thereof.

Owing to the use of the press-fit contacts 22, once the electrical connection is made, the press-fit contacts 22 secure the same permanently and the circuit board 15 does not need to be positioned accurately. However, instead of press-fit contacts 22, in principle other, possibly less advantageous types of connection can possibly be provided, such as solder joints or similar.

In order to be able to make the electrical connection between the vehicle sensor 11 and the circuit board 15 with little cost, a recess 30 may be formed in the region of the lower part of the housing 13. The connection between the circuit board 15 and the provided electrical conductors can be made through the recess 30 during assembly. In particular, the press-fit process for the press-fit contacts 22 in the circuit board 15 can be carried out through the recess 30 in a simple way. At the same time, the base 23 forms a connector 29 for passing the pressure medium through, such as in particular compressed air.

The housing 12 is connected to a base 23 of the unit of the vehicle that is to be controlled. This forms the lower end of the housing 12. The base 23 is typically also used for fastening the vehicle control unit 10 to the associated vehicle. In this case, the base 23 comprises a connector 29 for passing the pressure medium through from the pneumatics to the sensor 11 in order to be able to measure the pressure with the sensor 11. In this case, the housing 12 with the lower housing part 13 and the vehicle sensor 11 that is disposed there is inserted into the connector 29 during assembly. The pressure connection is made by this and a seal is achieved at the same time.

A hose that is not shown here can alternatively be passed through the base 23 to the vehicle sensor 11 in the region of a recess 24. The hose can for example be implemented as a pressure hose and can feed a suitable pressure medium to be measured, such as for example compressed air, to the vehicle sensor 11.

The components of the housing 12 and the base 23 are sealed with respect to each other via a plurality of seals 25, 26, 27.

In this case, the seals 25 are provided for sealing the lid of the housing 14 relative to the lower housing part 13. The electronics, i.e. in this case the circuit board 15, and the upper part of the sensor 11 are disposed in the interior of the upper part of the housing in the drawing that is enclosed relative to the surroundings. Two further seals 26 and 27 are provided for sealing the lower part of the housing 13 relative to the base 23 or the connector 29 of the unit to be controlled of the vehicle. The recess 24 for passing through the pressure medium is also sealed thereby relative to the interior of the housing.

Moreover, at least one seal 28 is provided for sealing the vehicle sensor 11 relative to the surroundings. This can for example be implemented as an O-ring seal or similar. It ensures that the recess 24 is sealed from the interior of the upper part of the housing containing the electronic components between the lid of the housing 14 and the lower housing part 13.

Figure 2:
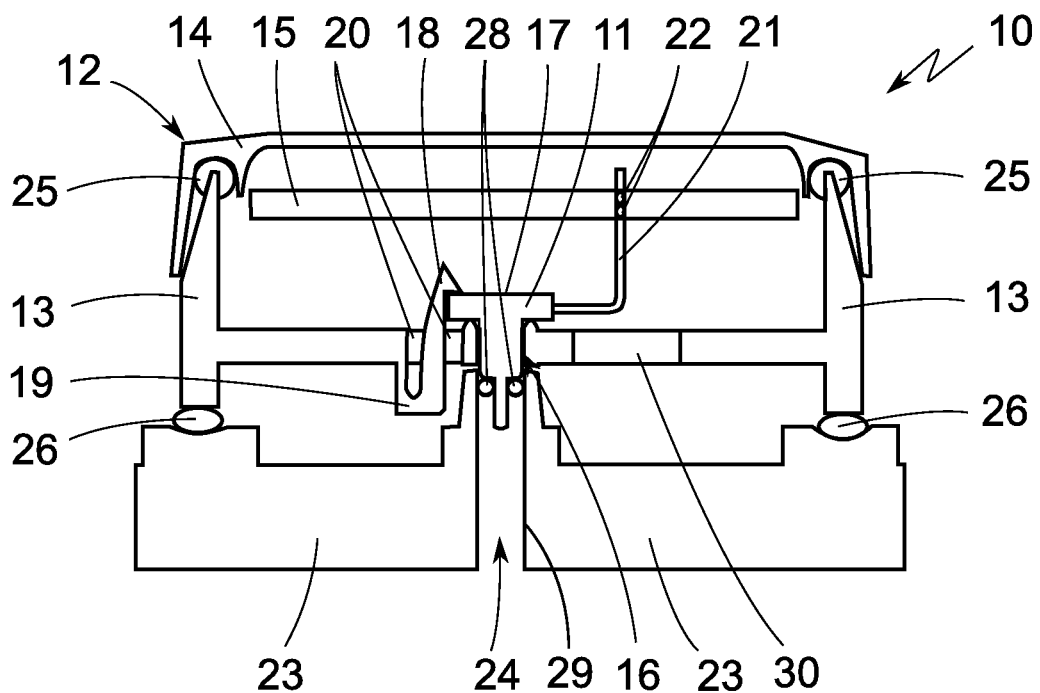
FIG. 2 shows a second exemplary embodiment of a vehicle control unit with a vehicle sensor according to the invention.

The second exemplary embodiment of FIG. 2 shows a somewhat modified design of the base 23.

The base 23 is sealed here directly relative to the vehicle sensor 11 with the seal 28. Thus, the outside of the housing 12 is separated from the interior thereof. A multiple seal, such as in the first exemplary embodiment, is thus not necessary in this case. Thus, seals are saved compared to the seals of the first exemplary embodiment. However, in the first exemplary embodiment a seal of the sensor 11 relative to the lower housing part 13 is already implemented. This is carried out here only after placement on the base 23.

The two versions comprise different advantages during manufacturing or in actual use. Depending on the purpose, one of the two exemplary embodiments shown or even further versions according to the invention can be used.

The terms "comprising" or "comprise" are used herein in their broadest sense to mean and encompass the notions of "including," "include," "consist(ing) essentially of," and "consist(ing) of. The use of "for example," "e.g.," "such as," and "including" to list illustrative examples does not limit to only the listed examples. Thus, "for example" or "such as" means "for example, but not limited to" or "such as, but not limited to" and encompasses other similar or equivalent examples. The term "about" as used herein serves to reasonably encompass or describe minor variations in numerical values measured by instrumental analysis or as a result of sample handling. Such minor variations may be in the order of ±0-25, ±0-10, ±0-5, or ±0-2.5, % of the numerical values. Further, The term "about" applies to both numerical values when associated with a range of values. Moreover, the term "about" may apply to numerical values even when not explicitly stated.

Generally, as used herein a hyphen "-" or dash "-" in a range of values is "to" or "through"; a ">" is "above" or "greater-than"; a "≥" is "at least" or "greater-than or equal to"; a "<" is "below" or "less-than"; and a "≤" is "at most" or "less-than or equal to." On an individual basis, each of the aforementioned applications for patent, patents, and/or patent application publications, is expressly incorporated herein by reference in its entirety in one or more non-limiting embodiments.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

The present invention has been described herein in an illustrative manner, and it is to be understood that the terminology which has been used is intended to be in the nature of words of description rather than of limitation. Many modifications and variations of the present invention are possible in light of the above teachings. The present invention may be practiced otherwise than as specifically described within the scope of the appended claims. The subject matter of all combinations of independent and dependent claims, both single and multiple dependent, is herein expressly contemplated.

What is claimed is:

1. A vehicle control unit comprising:
an electronic circuit,
a circuit board,
a housing, and
at least one vehicle sensor, wherein the at least one vehicle sensor comprises a pressure sensor, wherein the at least one vehicle sensor is electrically connected to the electronic circuit for receiving measurement values, and wherein the vehicle sensor is electrically connected to the circuit board via an electrical conductor extending through an opening in the circuit board and secured thereto by at least one press-fit contact within the opening, wherein the vehicle sensor extends at least partially through a recess in the housing for measuring a pressure value and is mechanically connected to the housing via a latching connection and/or a plug connection and/or a bayonet connection and/or a clamped connection.

2. The vehicle control unit as claimed in claim 1, wherein the vehicle sensor is mechanically connected to the housing and/or wherein the vehicle sensor comprises a sensor housing that is mechanically connected to the housing.

3. The vehicle control unit as claimed in claim 1, wherein the vehicle sensor or the sensor housing is mechanically connected to the housing via the latching connection, and wherein the latching connection comprises at least one latching hook for receiving and fixing the vehicle sensor.

4. The vehicle control unit as claimed in claim 1, wherein the electrical conductor is a flexible or rigid electrical line connecting the vehicle sensor to the electronic circuit or the circuit board.

5. The vehicle control unit as claimed in claim 1, wherein the housing comprises a holder and/or receptacle for the vehicle sensor.

6. The vehicle control unit as claimed in claim 1, wherein the vehicle sensor is disposed within the housing.

7. The vehicle control unit as claimed in claim 1, wherein the vehicle sensor is disposed on the outside of the housing.

8. The vehicle control unit as claimed in claim 1, further comprising a rigid pneumatic connection of the vehicle sensor and a source of the measurement values.

9. The vehicle control unit as claimed in claim 1, wherein the vehicle sensor is connected to a source of the measurement values via a flexible pneumatic connection and/or via a rigid connection.

10. The vehicle control unit as claimed in claim 1, wherein the vehicle sensor comprises a pressure sensor for a pneumatic system.

11. The vehicle control unit as claimed in claim 4, wherein the flexible or rigid electrical line to the electronic circuit or the circuit board comprises at least one of a lead frame, a cable, a conducting track, and a spring contact.

12. The vehicle control unit as claimed in claim 5, wherein the sensor housing has a shape complimentary to the holder or receptacle of the housing.

* * * * *